US006944438B2

(12) United States Patent

Pellat et al.

(10) Patent No.: US 6,944,438 B2
(45) Date of Patent: Sep. 13, 2005

(54) TRANSCONDUCTANCE STAGE AND DEVICE FOR COMMUNICATION BY HERTZIAN CHANNEL EQUIPPED WITH SUCH A STAGE

(75) Inventors: Bruno Pellat, Laval (FR); Jean-Charles Grasset, Moirans (FR)

(73) Assignee: STMicroelectronics SA, Montrouge (FR)

( * ) Notice: Subject to any disclaimer, the term of this patent is extended or adjusted under 35 U.S.C. 154(b) by 484 days.

(21) Appl. No.: 10/124,670

(22) Filed: Apr. 17, 2002

(65) Prior Publication Data

US 2003/0006836 A1 Jan. 9, 2003

(30) Foreign Application Priority Data

Apr. 20, 2001 (FR) ........................................... 01 05369

(51) Int. Cl.[7] ................................................ H04B 1/28

(52) U.S. Cl. ........................ 455/333; 330/252; 330/296

(58) Field of Search ................................ 330/250, 252, 330/296; 455/343.1, 127.1, 550.1, 127.2, 334, 313, 323, 326, 333; 327/113

(56) References Cited

U.S. PATENT DOCUMENTS

| | | | | |
|---|---|---|---|---|
| 4,247,825 A | | 1/1981 | Berger | 330/261 |
| 4,287,478 A | * | 9/1981 | Berger | 330/256 |
| 5,826,182 A | * | 10/1998 | Gilbert | 455/326 |
| 5,903,185 A | | 5/1999 | Cargill | 327/563 |
| 6,011,980 A | * | 1/2000 | Nagano et al. | 455/572 |
| 6,556,082 B1 | * | 4/2003 | Wang et al. | 330/288 |

FOREIGN PATENT DOCUMENTS

EP 0613248 A1 * 8/1994

* cited by examiner

*Primary Examiner*—Nguyen T. Vo
(74) *Attorney, Agent, or Firm*—Lisa K. Jorgenson; Allen, Dyer, Doppelt, Milbrath & Gilchrist, P.A.

(57) ABSTRACT

A transconductance stage includes at least one principal bipolar transistor having a base linked to an input terminal, a collector linked to an output terminal, and an emitter linked to a supply terminal through a resistor. At least one bipolar compensation transistor is connected in parallel to the principal transistor and linked without going through the resistor to the supply terminal. The value $R_E$ of the resistance is chosen so that $R_E*I_0>V_T/2$, where $V_T$ is the thermal voltage and $I_0$ is the quiescent current of the principal transistor.

26 Claims, 4 Drawing Sheets

TRANSCONDUCTANCE STAGE AND DEVICE FOR COMMUNICATION BY HERTZIAN CHANNEL EQUIPPED WITH SUCH A STAGE

FIELD OF THE INVENTION

The present invention relates to a transconductance stage with improved linearity, and more particularly, to a transconductance stage with low distortion for providing an output signal that is free from parasitic components linked to third order intermodulation products. The invention has applications in transmitters and receivers, and in particular, in communication equipment such as portable phones.

BACKGROUND OF THE INVENTION

A transconductance stage, also called a transconductor, is an electronic device that converts an input voltage into an output current. The voltage can be a voltage referenced relative to a potential or to a differential voltage. In the same way, the current can be a differential current.

FIG. 1 shows a possible embodiment of a very simple transconductance stage mounted around a bipolar transistor 10. A voltage $V_{in}$ is applied to the base of the transistor, while a current $I_{out}$ circulates in the collector linked to an output terminal 14. The transistor emitter is linked to a supply terminal 16 (e.g., ground) through a resistor, or more generally, a degeneracy impedance 20.

By naming the variations of the voltage of the transistor base v, and the variations in the collector current they produce i, the transconductance stage of FIG. 1 shows an equivalent transconductance $gm_{eq}$ such that:

$$gm_{eq} = \frac{i}{v} = \frac{gm}{1 + gm * Ze} \tag{1}$$

In this equation gm is the transconductance of the isolated transistor in the absence of degeneracy resistance. This is such that:

$$gm = I_O/V_T \tag{2}$$

where $I_O$ is the quiescent current of the transistor, and $V_T$ is the thermal voltage. The thermal voltage $V_T$ is such that $V_T$=kT/q, where T is the absolute operating temperature (expressed in Kelvin), k is Boltzmann's constant, and q is the electron charge.

When the transconductance stage is connected by its collector to a load impedance $Z_{OUT}$, that is, by terminal 14 in the figure, a voltage gain $G_V$ is obtained such that:

$$G_V = gm_{eq} * Z_{OUT} \tag{3}$$

In a receiver or transmitter, the transconductance stage transmits the frequency components of a signal applied to it, but also other components among which include the intermodulation product components. These components, generated by the transconductance stage, are due in particular, to a linearity defect.

As an illustration, if a signal received by the stage comprises two frequency components $F_1$ and $F_2$, the output signal comprises the fundamental components $F_1$ and $F_2$, and also their harmonics $2F_1$,$2F_2$, $3F_1$, $3F_2$, etc., of the second order intermodulation components of the type $F_1-F_2$ and $F_1+F_2$, as well as the third order intermodulation components of the type $2F_1-F_2$ or $2F_2-F_1$, for example.

The components of the intermodulation products, which are the parasitic components of the output signal, generally have low amplitudes compared to the components of the frequencies from which they are derived. Nonetheless, they are undesirable when their frequency coincides with the frequency of the desired signal.

For example, a frequency component F of low amplitude risks being in competition with a parasitic component of the identical $2F_1-F_2$ type. If $F-F_2=F_2-F_1$, these difficulties appear, in particular, in the domains such as that of Hertzian (i.e., radio waves) telecommunications, where certain channels, whose reception is very weak, risk being distorted by neighboring strong channels.

To augment the linearity of the transconductance stages, and thus reduce the amplitude of the parasitic components which may be generated, the stages are equipped with feedback. The feedback includes, for example, an emitter degeneracy resistor such as resistor 20 described in reference to FIG. 1. A higher resistance value improves the linearity of the stage.

The gain in linearity is obtained at the expense of an equivalent transconductance or a lower voltage gain. Concerning this subject, one can refer to equations (1) and (3) above. Thus, to obtain an output signal of the same amplitude as that which would be obtained without feedback, the supply power has to be raised. This requires raising the quiescent current crossing the transistor or the supply voltage. However, it turns out that for portable communication equipment, such as cellular phones operating on a portable energy source (an electrical battery, for example), increased energy consumption has a very negative influence on autonomy.

Another feedback possibility directed at improving the linearity of a transconductance stage is shown in FIG. 2. FIG. 2 shows a transconductance stage mounted around a transistor 10 associated with a parallel feedback branch 22 connected between the collector and the base. The input terminal 12 and the output terminal 14 correspond, as for the device in FIG. 1, to the base and to the collector. The emitter is linked directly to a supply terminal 16 (ground).

A feedback branch 22, connected between the input and output terminals, makes it possible to extract a fraction α of the output voltage from the input voltage. The equivalent transconductance $gm_{eq}$ of the stage of FIG. 2 is thus reduced. An increase in the feedback proportion α results in better linearity, but also a weaker equivalent transconductance. Thus, as in the device of FIG. 1, increasing the linearity is at the expense of greater electrical consumption. U.S. Pat. No. 5,826,182 discloses a transconductor operating in class AB and not in class A, like the stages of FIGS. 1 and 2.

The device described in the referenced U.S. patent has the advantage of reducing the third order components of the intermodulation product by significant proportions. However, a common base structure provides the device with a very low input impedance. Thus, means for adapting the impedance to a value of 50 Ω, normal for high frequency transmitters-receivers, would consequently reduce the transconductance significantly relative to an assembly of the same type as shown in FIGS. 1 and 2 to which the same adaptation impedance has been applied. The assemblies in FIGS. 1 and 2 benefit from the naturally high impedance of the assembly.

SUMMARY OF THE INVENTION

An object of the invention is to provide a transconductance stage which has none of the limitations of the devices described above.

Another object of the invention is to provide a transconductance stage with good linearity and low distortion, free from third order intermodulation product components, and having a high transconductance.

A further object of the invention is also to provide such a transconductance stage with low energy consumption.

Another object of the invention is to provide such a stage with a reduced influence on third order intermodulation components.

Yet another object of the invention is to provide a transconductance stage with an input impedance capable of being adapted easily to a value approaching 50Ω.

These and other objects, advantages and features of the invention are provided by a transconductance stage comprising at least one principal bipolar transistor having a base linked to an input terminal, a collector linked to an output terminal, and an emitter linked to a supply terminal through the intermediary of a degeneracy resistor.

At least one compensation bipolar transistor is connected in parallel to the principal transistor and linked to the supply terminal without going through the degeneracy resistor. The value $R_E$ of the degeneracy resistance of the principal transistor is chosen such that $R_E*I_0>V_T/2$, where $V_T$ is the thermodynamic voltage and $I_0$ is the quiescent current of the principal transistor. The choice of the degeneracy resistance $R_E$ is preferably made such that $R_E>>V_T/2I_0$, for example, $R_E>10V_T/2I_0$.

According to the invention, the compensation transistor is without degeneracy resistance when the electrical liaison resistance in the emitter of this transistor at the supply terminal is sufficiently weak to be neglected compared to the degeneracy resistance of the principal transistor. In other words, with r representing the value of a degeneracy resistance of the compensation transistor, the value r should be such that $r<<V_T/2I'_0*I'_0$ is the quiescent current of the compensation transistor.

Moreover, it is understood that supply terminal means a terminal used for the polarization of transistors, that is, for setting their quiescent currents. The supply terminal can be a supply source potential, for example, or ground.

Based upon the choice of the degeneracy resistance of the principal transistor indicated above, the phase of the third order intermodulation product components, generated by the principal transistor and the compensation transistor, have opposite signs and oppose each other. The resulting amplitude of the third order components is thus lower than that of the third order components which each of the transistors considered separately would have generated.

A suitable polarization of the compensation transistor, and an adjustment of its quiescent current, makes it possible to generate third order harmonics with this transistor which are also equal in amplitude to those generated by the principal transistor. In this case, the third order harmonics of the two transistors not only oppose each other but are cancelled.

In a particular embodiment of the transconductance stage, an inductor links the principal transistor and the compensation transistor to the supply terminal. The inductor is connected in series with the degeneracy resistor between the emitter of the principal transistor and the supply terminal.

This inductor raises the input impedance of the stage. Its value can be chosen as a function of a desired input impedance, in such a way as to adjust this impedance closer to the usual value of 50Ω. An impedance adaptation can be made by associating a resistor or other suitable passive components at the base of the transistor.

According to the invention, the transconductance stage can further comprise an inductor, called a parallel inductor, connected in parallel to the degeneracy resistor of the principal transistor. The parallel inductor has a value $L_E$ such that:

$$L_E<<R_E/2\pi\Delta F \text{ and } L_E>>R_E/2\pi F$$

F is a central operating frequency of the transconductance stage, and ΔF is the width of a band of frequencies capable of containing third order intermodulation product components generated by the stage.

The first condition indicated for choosing the value of the parallel inductance makes it possible for the inductor to operate like a short-circuit towards the supply terminal to filter the frequency components whose value corresponds to the chosen frequency band ΔF. These frequencies correspond to second order intermodulation components, of the type $F_1-F_2$ or $F_2-F_1$, with reference to the example chosen in the introductory part of the description.

The second order intermodulation components combine with the fundamental components to generate new third order components. The filtering carried out by the parallel inductor makes it possible to limit or to eliminate this phenomenon. The second condition for choosing the value $L_E$ of the parallel inductance makes it possible to provide the inductor with an impedance very much higher than that of the degeneracy resistance such that it does not disturb the value of this resistance at the operational frequencies around the value F.

The transconductance stage of the invention can be a simple stage or a differential stage. In the second case, it comprises first and second principal transistors and first and second compensation transistors connected in parallel respectively to the first and second principal transistors. The bases of the first and second principal transistors are linked respectively to the first and second input terminals forming a differential input. The collectors of the first and second principal transistors are linked respectively to the first and second output terminals. The emitters of the first and second principal transistors are linked respectively to a supply terminal through the intermediary of a first and second degeneracy resistor.

Moreover, the first and second compensation transistors are linked without degeneracy resistance to the supply terminal. The first and second degeneracy resistors of the principal transistors have the values $R_{E1}$ and $R_{E2}$ such that:

$$R_{E1}*I_1>V_T/2 \text{ and } R_{E2}*I_2>V_T/2$$

The terms $I_1$ and $I_2$ refer to the quiescent currents of the first and second principal transistors and where $V_T$ refers to the thermodynamic voltage.

The criteria for selection of the degeneracy resistances for each part of the differential stage are the same as for the single stage described above. Preferably:

$$R_{E1}*I_1>>V_T/2 \text{ and } R_{E2}*I_2>>V_T/2.$$

In the same way, the transconductance stage can be equipped with inductors for facilitating impedance adaptation of the inputs. The transconductance stage then comprises first and second inductors linking respectively the first and second principal and compensation transistors to the supply terminal. The first and second inductors are connected in series with the first and second degeneracy resistors between the emitters of the principal transistors and the supply terminal.

Furthermore, the transconductance stage can comprise an inductor of value L connected between the emitters of the principal transistors. The value of the inductance is chosen such that it presents a high impedance for the signal corresponding closely to the working frequency, so that it does not distort the operation for these frequencies. It is also chosen so that it has a low impedance for the components of the second order intermodulation product in order to filter them.

Considering that the degeneracy resistances of the first and second principal transistors are equal, both having the same value $R_E$, and L can be chosen such that:

$$\frac{L}{2}*2\pi*\Delta F<<R_E \text{ and } \frac{L}{2}*2\pi*F>>R_E$$

The values ΔF and F are the same as those taken into consideration above.

The invention relates not only to a transconductance stage but also to a transmission or reception stage comprising, between an antenna and a modulator or demodulator, a low noise amplifier and a frequency translation device equipped with a mixer, in which at least one of the mixers and amplifiers comprises a transconductance stage as described above. The invention also concerns the use of a transconductance stage in a portable phone.

BRIEF DESCRIPTION OF THE DRAWINGS

Other characteristics and advantages of the invention will be understood from the following description. This is provided as a purely illustrative and non-limiting example.

DETAILED DESCRIPTION OF THE PREFERRED EMBODIMENTS

Figure 1:
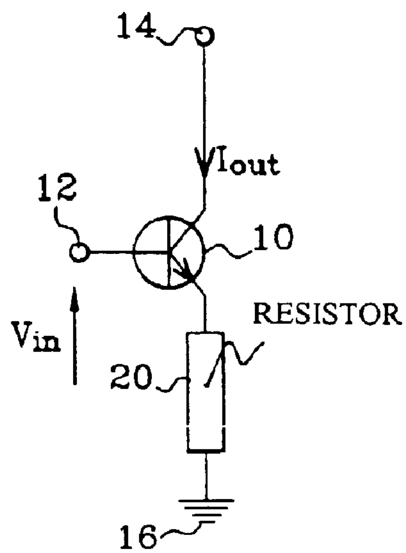
FIG. 1 is a diagram of a transconductance stage with a series feedback according to the prior art.
Figure 2:
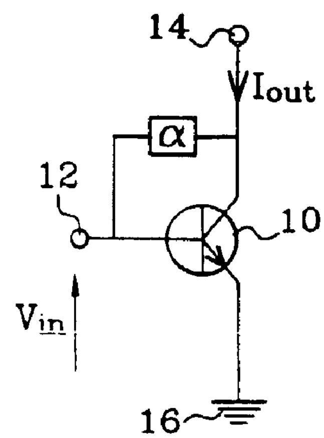
FIG. 2 is a diagram of a transconductance stage with a parallel feedback according to the prior art.

In the following description, identical, equivalent or similar elements of the different figures are marked with the same reference numbers. The transconductance stage of FIG. 3A comprises a first transistor 110, called the principal transistor, and a second transistor 130, called the compensation transistor, connected in parallel with the principal transistor. Even though this is not a necessary condition for the operation of the stage, the two transistors preferably have the same specifications.

The transistor bases are connected to an input terminal 112 to which an input voltage $V_{in}$ is applied. The transistor collectors are linked to an output terminal 114 for connecting to a load (not shown) for the stage. The current crossing this load is called $I_{out}$. The quiescent currents of the compensation transistor and the principal transistor are called, respectively, $I_1$ and $I_0$. These currents are fixed by the specifications of the transistors and possibly by polarization resistors (not shown).

The emitters of the transistors are linked to a supply terminal 116 which, in this figure, corresponds to ground. The emitter of the compensation transistor is connected directly to the supply terminal in such a way that it is not degenerate. The emitter of the principal transistor is connected to the supply terminal through the intermediary of a degeneracy resistor 120, of value $R_E$. The resistor 120 can be formed from a single resistive component or can comprise several resistive components. As stated above, the value of the resistance $R_E$ is chosen such that $R_E*I_0$ is greater than $V_T/2$, and may even be very much greater.

The phase of the harmonic of the third order intermodulation product, as far as the principal transistor is concerned, depends on the value of the degeneracy resistance. This phase reverses around a value of $R_E$ which is exactly $V_T/2I_0$. As an example, if the phase of the third order harmonic is 180° for a value zero or close to zero for the degeneracy resistance, it is 90° for a value $R_E=V_T/2I_0$ and zero (0°) for a high value of $R_E$ compared with $V_T/2I_0$. Thus, the case of a phase equal to 180° corresponds to the compensation transistor whose emitter is not degenerate, whereas the case of a phase of 0° corresponds to the principal transistor.

Since the phases of the components of the third order intermodulation products are opposed, these components, coming from the principal transistor and the compensation transistor, cancel each other. When the amplitude of the third order components is almost the same for the two transistors, the compensation can attain complete elimination of these components. This ideal case can be approached, for example, by using transistors with almost identical specifications and by adjusting the quiescent current $I_1$ of the compensation transistor.

TABLE I below provides, for comparison, the output amplitudes of a desired signal at a frequency of 2 GHz, and the amplitude measured in dBc relative to the amplitude of the fundamental, called Imd3, of the components of the third order intermodulation products for a transconductance stage according to FIG. 1 of the prior art, and for a transconductance stage according to the invention and to FIG. 3A. In the two cases, the frequency offset of the component of the third order intermodulation products is ΔF=1 MHz, the input voltage $V_{in}$ is 10 mV, and the value of the degeneracy resistance is 20Ω.

TABLE I

Figure 3A:
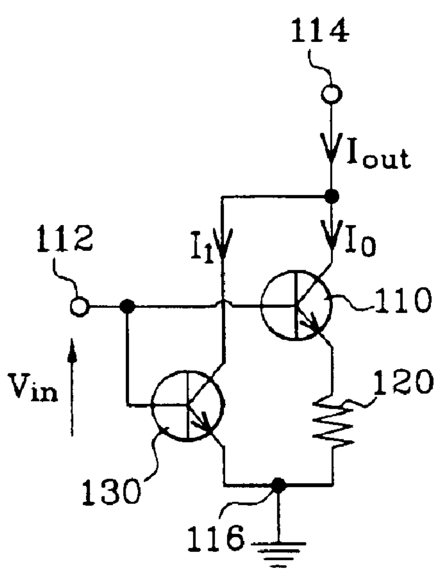
FIGS. 3A and 3B are diagrams of a single transconductance stage according to the present invention.

| Specification/ Performance | Prior art/ FIG. 1 | Invention/ FIG. 3A |
|---|---|---|
| Degeneracy resistance | $R_E$ = 20Ω | $R_E$ = 20Ω |
| Quiescent current | $I_0$ = 2.947 mA | $I_0$ = 2.947 mA<br>$I_1$ = 26.8 μA |
| $I_{out}$ | −69.59 dBI | −69.28 dBI |
| Imd3 (attenuation) | −65.64 dBc | −103.0 dBc |

It can be seen from consulting TABLE I, that for almost identical quiescent currents (close to 26.8 μA), that is, for almost identical electrical consumption, the components of the intermodulation products undergo very high attenuation in the transconductance stage according to the invention (−103 dB instead of −65 dB).

In comparison, to obtain such an attenuation with the transconductance stage of the prior art, the value $R_E$ would have had to of been raised to 27.5Ω and the quiescent current $I_0$ of the degeneracy resistor would have had to have been raised to 14.8 mA. These measures would thus have led to a significant increase in the consumption of electrical energy.

Figure 3B:
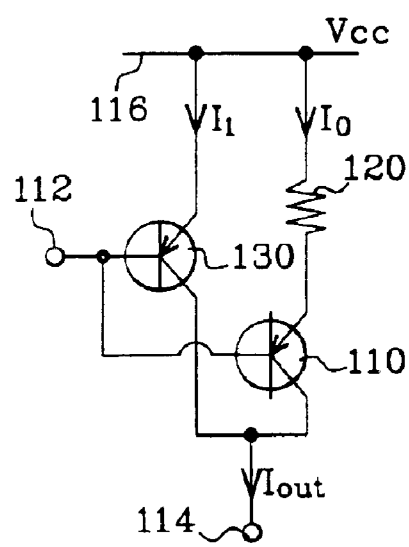

FIG. 3A shows a stage mounted according to the invention, built around transistors of the NPN type. An almost identical stage can be produced, as shown in FIG. 3B, from PNP transistors. The output terminal 114 remains connected to the transistor collectors. The supply terminal 116 is no longer the ground terminal as in the above example, but is a supply terminal with a potential Vcc. The potential Vcc is positive relative to ground. As for the rest, and in particular the choice of the degeneracy resistance, one can refer to the description relating to FIG. 3A.

Figure 4:
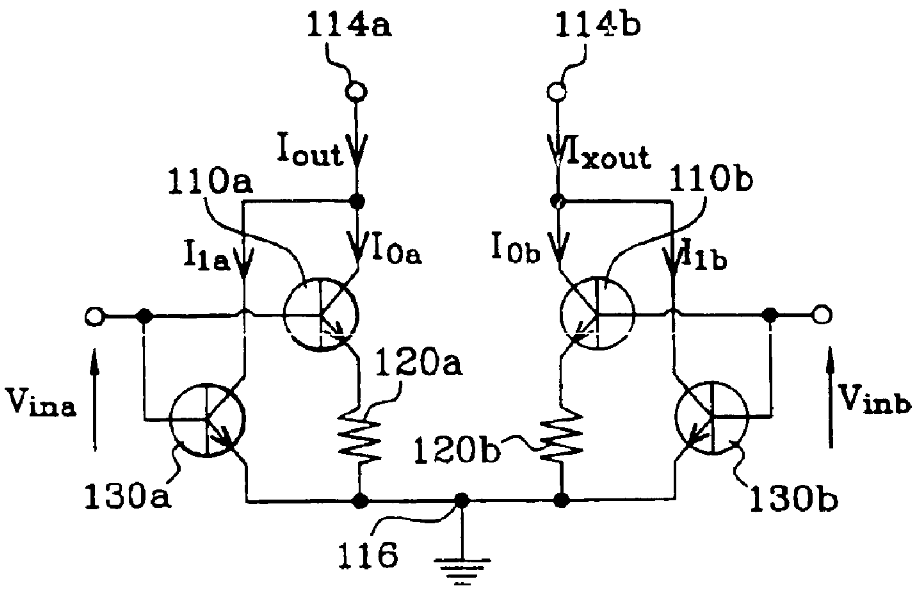
FIG. 4 is a diagram of a differential transconductance stage according to the present invention.

FIG. 4 shows another possibility for mounting a transconductance stage according to the invention. It concerns a differential stage. Two principal transistors 110*a* and 110*b*, in with their emitter degeneracy are associated with two compensation transistors 130*a* and 130*b*, are without degeneracy. The two compensation transistors 130*a* and 130*b* are respectively connected in parallel to the principal transistors. The transistors may be identical or different. The differential stage arises from the association of two single stages according to FIG. 3A or 3B.

The specifications corresponding to the device of FIG. 3A are not described completely here. The values $R_{Ea}$ and $R_{Eb}$ of the degeneracy resistors 120*a* and 120*b*, connected to the emitters of the principal transistors can be identical or different. However, they are both chosen according to the criteria mentioned above, that is, higher and preferably very much higher than $V_T/2I_0a$ or $V_T/2I_0b$, where $I_0a$ and $I_0b$ are the quiescent currents of the principal transistor under consideration.

The transconductance stage has two output terminals 114*a* and 114*b* which deliver the output currents $I_{out}$ and $I_{xout}$. The dynamic currents must not be confused with the currents $I_1a$, $I_1b$, $I_0a$ and $I_0b$ shown in the figure. The currents $I_1a$, $I_1b$, $I_0a$ and $I_0b$ are the quiescent currents of the principal and compensation transistors. The stage input comprises two input terminals which, in FIG. 4, are the terminals 112*a* and 112*b*. These terminals receive the input voltages $V_{ina}$ and $V_{inb}$.

Although it is not described in detail here, the symmetrical transconductance stage can also be produced from PNP transistors. Concerning this, reference can be made to FIG. 3B and to the corresponding description.

When the transconductance stage is to be used in a transmitter or receiver, its input is adapted to a real impedance on the order of 50Ω. The impedance adaptation can take place, for example, by a series connection with the stage input of an appropriate resistance. However, the transconductance stage according to FIGS. 3A, 3B or 4 still shows, in the absence of special adaptation, a relatively low resistive impedance. This makes adaptation to 50Ω more difficult.

Figure 5:
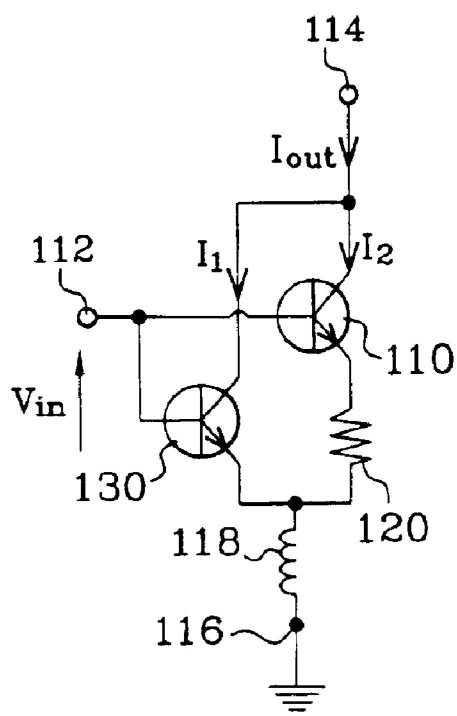
FIGS. 5 and 6 are diagrams of another embodiment of the transconductance stages illustrated in FIGS. 3A and 4.

FIG. 5 shows a development of the transconductance stage of FIG. 3A, making it possible, without inserting any supplementary resistor, to raise the resistive value of its high frequency input impedance. According to the mounting illustrated in FIG. 5, an inductance 118 of value L is inserted between the emitter of the compensation transistor and the supply terminal 116. The inductance is also linked to the emitter of the principal transistor through the intermediary of the degeneracy resistor 120. Thus, the inductance 118 is in series with this resistor between the emitter of the principal transistor and the supply terminal.

The value of the inductance 118 can be chosen, for example, as a function of a transition pulse of the stage, in such a way that the real part of the input impedance is on the order of 50Ω. As an example, a value of 0.8 nH can be chosen.

TABLE II below demonstrates the influence of the inductance 118 in the transconductance stage of FIG. 5, in comparison with that of FIG. 3A.

TABLE II

| Specifications | FIG. 3A without 118 | FIG. 5 with 118 |
|---|---|---|
| $I_1$ | 400 μA | 400 μA |
| $I_0$ | 5 mA | 5 mA |
| $R_E$ | 5Ω | 5Ω |
| L (118) | without (0 nH) | with (1 nH) |
| input impedance at 2 GHz | 9–66 | 80–63 |

In this table $I_1$, $I_0$, $R_E$ and L correspond respectively to the quiescent current of the compensation transistor 130, that of the principal transistor 110, the value of the degeneracy resistor 120, and the value of the inductor 118. It is evident that the real part of the input impedance is greatly improved.

Figure 6:
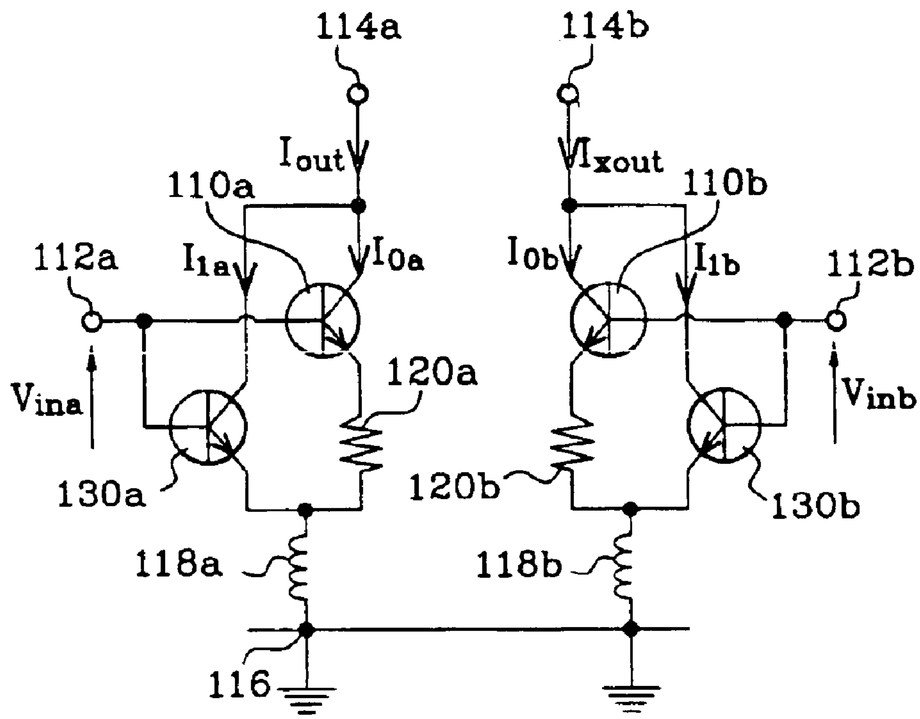

FIG. 6 shows the use of impedance adaptation inductors in a differential stage. The degeneracy resistors of the two principal transistors are no longer linked together to the supply terminal 116, but are each linked to the supply terminal 116 by an impedance adaptation inductor. These inductors, references 118*a* and 118*b*, are respectively in series with the degeneracy resistors between the emitters of the principal transistors and the supply terminal. Moreover, they are linked directly to the emitters of the compensation transistors.

As noted in the introductory part of the text, the signal comprises not only third order intermodulation products but also second order intermodulation products. The latter, combined with the fundamental components, are capable of generating supplementary third order components.

Figure 7:
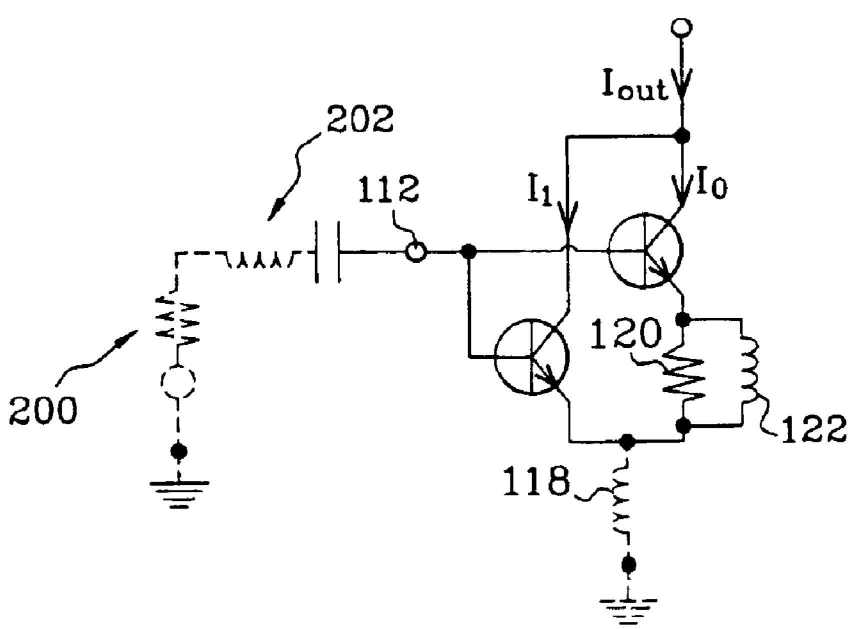
FIGS. 7 and 8 are diagrams of yet another embodiment of the transconductance stages illustrated in FIGS. 3A and 4.

FIG. 7 shows a development of the transconductance stage of the invention which is directed to eliminating or reducing the second order components, and hence, those of the third order. The stage in FIG. 7 comprises the components of FIG. 5 with an added inductor 122 connected in parallel to the degeneracy resistor terminals 120. In general, it is considered that the parallel inductor 122 is connected in parallel to the degeneracy resistor 120 when it is connected in parallel to all or part of this resistor.

The value $L_E$ of the parallel inductor 122 is chosen such that it is transparent, that is, it has a very high impedance for the components corresponding to the fundamental frequencies F of the desired signal. It is also chosen to filter, that is, to present a low impedance for a frequency band ΔF corresponding to second order intermodulation. The orders of magnitude of the frequencies F and ΔF are very different. The fundamental frequencies F of the desired signal are on the order of 1 GHz, for example, whereas the intermodulation frequencies ΔF (for example, $F_2-F_1$) are on the order of 1 MHz.

As mentioned above, the parallel inductor 122 is thus chosen such that:

$$L_E \ll R_E/2\pi\Delta F \text{ and } L_E \gg R_E/2\pi F.$$

Figure 8:
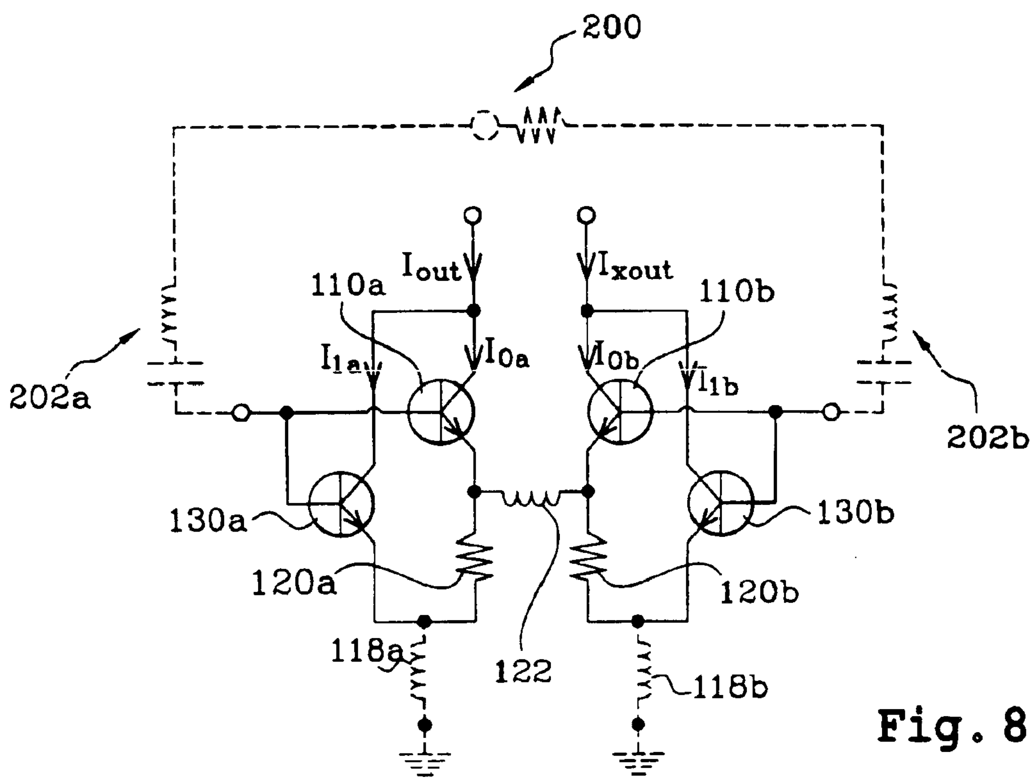

FIG. 8 shows the application of this development for a differential transconductance stage according to FIG. 6. An inductor 122 is connected between the emitters of the principal transistors 110*a* and 110*b*. The value of this inductance is determined according to the same criteria as those mentioned above.

The impedance adaptation inductors 118, 118*a* and 118*b* are shown in dotted lines in FIGS. 7 and 8. Even though they are part of the illustrated circuit, they are not indispensable. Moreover, the voltage supplies 200 and the impedance adaptation components 202, 202*a* and 202*b* are also shown, linked to the input terminals of the stages of FIGS. 7 and 8. The impedance adaptation components comprise an inductor and/or a capacitor in series. They also are shown in dotted lines since they are optional.

Figure 9A:
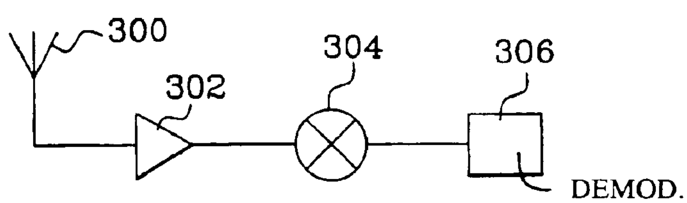
FIGS. 9A and 9B are simplified drawings of a receiver and a transmitter equipped with a transconductance stage according to the present invention.
Figure 9B:
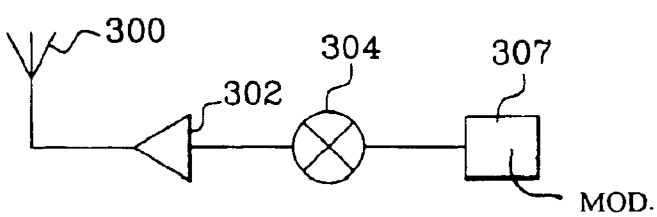

FIGS. 9A and 9B show the respective principal elements of a receiver stage and a transmitter stage of a portable phone, or another communication device. In particular, it concerns an antenna 300, an amplifier 302, a mixer 304 and a demodulator 306 (FIG. 9A) or a modulator 307 (FIG. 9B). The mixer 304, associated with a local oscillator (not shown), is part of a frequency translation device. A transconductance stage according to the invention and such as described above, can be used in particular in the mixer 304 or in the amplifier 302 as input stage, for example.

That which is claimed is:

1. A transconductance stage comprising:

an input terminal and an output terminal;

a resistor connected to a supply terminal;

at least one bipolar principal transistor comprising a base connected to the input terminal, a collector connected to the output terminal, and an emitter connected to the supply terminal through said resistor; and at least one bipolar compensation transistor connected in parallel to said at least one bipolar principal transistor and being connected to the supply terminal without going through said resistor;

a resistance value $R_E$ of said resistor being such that $R_E*I_0>V_T/2$, where $V_T$ is a thermal voltage and $I_0$ is a quiescent current of said at least one bipolar principal transistor.

2. A transconductance stage according to claim 1, wherein the resistance value $R_E$ is such that $R_E*I_0>10V_T/2$.

3. A transconductance stage according to claim 1, further comprising a first inductor linking said at least one bipolar principal transistor and said at least one bipolar compensation transistor to the supply terminal, said first inductor being connected in series with said resistor and to the emitter of said at least one bipolar principal transistor.

4. A transconductance stage according to claim 1, further comprising a second inductor connected in parallel to said resistor, said second inductor having an inductance value $L_E$ such that $L_E<<R_E/2\pi\Delta F$ and $L_E>>R_E/2\pi\Delta F$, with F being a central operating frequency of the transconductance stage and $\Delta F$ corresponding to a band of frequencies containing components of a third order intermodulation product generated by the transconductance stage.

5. A differential transconductance stage comprising:

a pair of input terminals and a pair of output terminals;

first and second resistors connected to a supply terminal;

first and second principal transistors, each principal transistor comprising a control terminal connected to a respective input terminal so that the pair of inputs form a differential input, a first conduction terminal connected to a respective output terminal, and a second conduction terminal connected to the supply terminal through a respective resistor; and first and second compensation transistors respectively connected in parallel to said first and second principal transistors and being connected to the supply terminal without going through said first and second resistors;

said first and second resistors respectively having resistance values $R_{E1}$ and $R_{E2}$ such that $R_{E1}*I_1>V_T/2$ and $R_{E2}*I_0>V_T/2$, with $I_1$ and $I_0$ being quiescent currents of said first and second principal transistors and $V_T$ being a thermal voltage.

6. A differential transconductance stage according to claim 5, further comprising first and second inductors linking respectively said first and second principal and compensation transistors to the supply terminal, said first and second inductors respectively connected in series with said first and second resistors and respectively connected to the second conduction terminals of said first and second principal transistors.

7. A differential transconductance stage according to claim 5, further comprising a first inductor connected in parallel to said first resistor, and a second inductor connected in parallel to said second resistor.

8. A differential transconductance stage according to claim 5, wherein said first and second principal transistors and said first and second compensation transistors each comprises a bipolar transistor, with the control terminal and the first and second conduction terminals respectively corresponding to a base, a collector and an emitter thereof.

9. A receiver comprising:

a low noise amplifier;

a mixer circuit connected to said low noise amplifier; and at least one of said low noise amplifier and said mixer comprising a transconductance stage comprising an input terminal and an output terminal, a resistor connected to a supply terminal, at least one principal transistor comprising a control terminal connected to the input terminal, a first conduction terminal connected to the output terminal, and a second conduction terminal connected to the supply terminal, through said resistor, and at least one compensation transistor connected in parallel to said at least one principal transistor and being connected to the supply terminal without going through said resistor, a resistance value $R_E$ of said resistor being such that $R_E*I_0>V_T/2$, where $V_T$ is a thermal voltage and $I_0$ is a quiescent current of said at least one principal transistor.

10. A receiver according to claim 9, wherein the resistance value $R_E$ is such that $R_E*I_0>10V_T/2$.

11. A receiver according to claim 9, wherein said transconductance stage further comprises a first inductor linking said at least one principal transistor and said at least one compensation transistor to the supply terminal, said inductor being connected in series with said resistor and to the second conduction terminal of said at least one principal transistor.

12. A receiver according to claim 9, wherein said transconductance stage further comprises a second inductor connected in parallel to said resistor, said second inductor having an inductance value $L_E$ such that $L_E<<R_E/2\pi\Delta F$ and $L_E>>R_E/2\pi F$, with F being a central operating frequency of the transconductance stage and $\Delta F$ corresponding to a band of frequencies containing component of a third order intermodulation product generated by the transconductance stage.

13. A receiver according to claim 9, further comprising a demodulator connected to said mixer circuit.

14. A receiver according to claim 9, wherein the receiver is integrated into a cellular mobile telephone.

15. A receiver according to claim 9, wherein said at least one principal transistor and said at least one compensation transistor each comprises a bipolar transistor, with the control terminal and the first and second conduction terminals respectively corresponding to a base, a collector and an emitter thereof.

16. A transmitter comprising:

a low noise amplifier:

a mixer circuit connected to said low noise amplifier; and at least one of said low noise amplifier and said mixer comprising a transconductance stage comprising an input terminal and an output terminal, a resistor connected to a supply terminal, at least one principal transistor comprising a control terminal connected to the input terminal, a first conduction terminal connected to the output terminal, and a second conduction terminal connected to the supply terminal through said resistor, and at least one compensation transistor connected in parallel to said at least one principal transistor and being connected to the supply terminal without going through said resistor, a resistance value $R_E$ of said resistor being such that $R_E*I_0>V_T/2$, where $V_T$ is a thermal voltage and $I_0$ is a quiescent current of said at least one principal transistor.

17. A transmitter according to claim 16, wherein the resistance value $R_E$ is such that $R_E*I_0>10V_T/2$.

18. A transmitter according to claim 16, wherein said transconductance stage further comprises a first inductor linking said at least one principal transistor and said at least on compensation transistor to the supply terminal, said inductor being connected in series with said resistor and to the second conduction terminal of said at least one principal transistor.

19. A transmitter according to claim 16, wherein said transconductance stage further comprises a second inductor connected in parallel to said resistor, said second inductor having an inductance value $L_E$ such that $L_E<<R_E/2\pi\Delta F$ and $L_E>>R_E/2\pi\Delta F$, with F being a central operating frequency of the transconductance stage and ΔF corresponding to a band of frequencies containing components of a third order intermodulation product generated by the transconductance stage.

20. A transmitter according to claim 16, further comprising a modulator connected to said mixer circuit.

21. A transmitter according to claim 16, wherein the transmitter is integrated into a cellular mobile telephone.

22. A transmitter according to claim 16, wherein said at least one principal transistor and said at least one compensation transistor each comprises a bipolar transistor, with the control terminal and the first and second conduction terminals respectively corresponding to a base, a collector and an emitter thereof.

23. A method for forming a transconductance stage comprising an input terminal and an output terminal, the method comprising;

connecting a resistor to a supply terminal;

connecting at least one principal transistor comprising a control terminal connected to the input terminal, a first conduction terminal connected to the output terminal, and a second conduction terminal connected to the supply terminal through said resistor; and connecting at least one compensation transistor in parallel to the at least one principal transistor and to the supply terminal without going through the resistor;

a resistance value $R_E$ of the resistor being such that $R_E*I_0>V_T/2$, where $V_T$ in a thermal voltage and $I_0$ is a quiescent current of said at least one bipolar principal transistor.

24. A method according to claim 23, wherein the resistance value $R_E$ is such that $R_E*I_0>10V_T/2$.

25. A method according to claim 23, further comprising connecting a first inductor between the at least one principal transistor and the at least one compensation transistor to the supply terminal, the first inductor being connected in series with the resistor and to the second conduction terminal of the at least one principal transistor.

26. A method according to claim 23, further comprising connecting a second inductor in parallel to the resistor, the second inductor having an inductance value $L_E$ such that $L_E<<R_E/2\pi\Delta F$ and $L_E>>R_E/2\pi F$, with F being a central operating frequency of the transconductance stage and ΔF corresponding to a band of frequencies containing components of a third order intermodulation product generated by the transconductance stage.

* * * * *

UNITED STATES PATENT AND TRADEMARK OFFICE

CERTIFICATE OF CORRECTION

PATENT NO. : 6,944,438 B2
DATED : September 13, 2005
INVENTOR(S) : Bruno Pellat and Jean-Charles Grasset It is certified that error appears in the above-identified patent and that said Letters Patent is hereby corrected as shown below:

<u>Column 9,</u>
Line 49, delete "$L_E << R_E/2\pi\Delta F$" insert -- $L_E >> R_E/2\pi F$ --.

<u>Column 11,</u>
Line 31, delete "on compensation" insert -- one compensation --.

Signed and Sealed this

Fourteenth Day of March, 2006

JON W. DUDAS
*Director of the United States Patent and Trademark Office*